(12) United States Patent
Kim

(10) Patent No.: US 11,215,669 B2
(45) Date of Patent: Jan. 4, 2022

(54) APPARATUS AND METHOD FOR MEASURING VOLTAGE

(71) Applicant: LG Chem, Ltd., Seoul (KR)

(72) Inventor: Dong-Hyeon Kim, Daejeon (KR)

(73) Assignee: LG Chem, Ltd.

( * ) Notice: Subject to any disclaimer, the term of this patent is extended or adjusted under 35 U.S.C. 154(b) by 190 days.

(21) Appl. No.: 16/625,856

(22) PCT Filed: Nov. 19, 2018

(86) PCT No.: PCT/KR2018/014210
§ 371 (c)(1),
(2) Date: Dec. 23, 2019

(87) PCT Pub. No.: WO2019/117487
PCT Pub. Date: Jun. 20, 2019

(65) Prior Publication Data
US 2020/0124678 A1  Apr. 23, 2020

(30) Foreign Application Priority Data
Dec. 14, 2017  (KR) ......................... 10-2017-0172491

(51) Int. Cl.
*G01R 31/3835*  (2019.01)
*G01R 31/396*  (2019.01)
(Continued)

(52) U.S. Cl.
CPC ....... *G01R 31/3835* (2019.01); *G01R 31/396* (2019.01); *H01M 10/482* (2013.01);
(Continued)

(58) Field of Classification Search
CPC .............. G01R 31/3835; G01R 31/396; G01R 31/3842; G01R 19/16542;
(Continued)

(56) References Cited

U.S. PATENT DOCUMENTS 5,744,962 A * 4/1998 Alber ................. G01R 31/3648
324/426
6,313,637 B1  11/2001 Iino et al.
(Continued)

FOREIGN PATENT DOCUMENTS

CN  101409695 A  4/2009
CN  101828123 A  9/2010
(Continued)

OTHER PUBLICATIONS

Extended European Search Report with Written Opinion for Application No. 18887333.5 dated Sep. 22, 2020, 10 pages.
(Continued)

*Primary Examiner* — M Baye Diao
(74) *Attorney, Agent, or Firm* — Lerner, David, Littenberg, Krumholz & Mentlik, LLP

(57) ABSTRACT

An apparatus and method for measuring a voltage across two ends of each of a plurality of secondary batteries included in a battery module. The battery module further includes a busbar. The busbar is electrically connected between a negative terminal of one of the plurality of secondary batteries and a negative terminal of the battery module. The apparatus includes a plurality of voltage input terminals electrically connected to the two ends of each of the plurality of secondary batteries to receive the voltage across the two ends of each of the plurality of secondary batteries. One of the plurality of voltage input terminals is a reference voltage input terminal electrically separated from a first reference ground. The reference voltage input terminal is electrically connected to a second reference ground connected to one end of the busbar to receive voltage applied to the second reference ground.

9 Claims, 7 Drawing Sheets

(51) Int. Cl.
 H01M 10/48 (2006.01)
 H02J 7/00 (2006.01)
 H01M 50/502 (2021.01)

(52) U.S. Cl.
 CPC ......... H01M 50/502 (2021.01); H02J 7/0013 (2013.01); H02J 7/0047 (2013.01)

(58) Field of Classification Search
 CPC . G01R 19/16576; G01R 31/364; Y02E 60/10; H01M 50/502; H01M 10/482; H01M 10/441; H01M 50/20; H01M 2010/4271; H01M 10/425; H01M 10/4207; H01M 2220/30; H02J 7/0013; H02J 7/0047
 USPC .......................................................... 324/426
 See application file for complete search history.

(56) References Cited

U.S. PATENT DOCUMENTS

| | | | | |
|---|---|---|---|---|
| 7,646,176 B2 * | 1/2010 | Yamamoto | ........... | G01R 31/392 320/150 |
| 8,436,575 B2 * | 5/2013 | Sim | ...................... | H01M 10/425 320/106 |
| 8,933,702 B2 * | 1/2015 | Deveau | ................. | G01R 31/386 324/429 |
| 8,963,499 B2 * | 2/2015 | Choi | ..................... | H02J 7/0026 320/118 |
| 9,041,345 B2 * | 5/2015 | Choi | ..................... | H02J 7/0016 320/107 |
| 9,041,359 B2 * | 5/2015 | Ro | .......................... | H02J 50/80 320/135 |
| 9,166,435 B2 | 10/2015 | Zeier | | |
| 9,457,681 B2 * | 10/2016 | Kittell | ................... | H01M 10/44 |
| 10,180,460 B1 * | 1/2019 | Castelaz | ........... | G01R 31/3842 |
| 2009/0091403 A1 | 4/2009 | Hemmerlein et al. | | |
| 2009/0309545 A1 | 12/2009 | Kunimitsu | | |
| 2010/0219837 A1 | 9/2010 | Austerschulte | | |
| 2010/0271035 A1 | 10/2010 | Heo et al. | | |
| 2011/0121837 A1 | 5/2011 | Kim et al. | | |
| 2012/0001640 A1 | 1/2012 | Hashimoto et al. | | |
| 2012/0019061 A1 | 1/2012 | Nishihara et al. | | |
| 2012/0044010 A1 | 2/2012 | Murakami | | |
| 2012/0250203 A1 | 10/2012 | Makihara | | |
| 2012/0262180 A1 * | 10/2012 | Ishishita | .............. | G01R 31/396 324/430 |
| 2013/0022844 A1 | 1/2013 | Ishikawa et al. | | |
| 2013/0257383 A1 * | 10/2013 | Shim | .................... | H02J 7/0048 320/134 |
| 2014/0043032 A1 | 2/2014 | Makino et al. | | |
| 2014/0125357 A1 | 5/2014 | Blondin et al. | | |
| 2014/0176148 A1 | 6/2014 | Makihara et al. | | |
| 2014/0232412 A1 | 8/2014 | Sano | | |
| 2015/0168484 A1 | 6/2015 | Ratz | | |
| 2016/0356828 A1 | 12/2016 | Bacher et al. | | |
| 2017/0030976 A1 | 2/2017 | Suzuki et al. | | |
| 2017/0123010 A1 | 5/2017 | Sekiguchi | | |
| 2017/0315176 A1 | 11/2017 | Kanagawa | | |
| 2019/0067758 A1 | 2/2019 | Yamada | | |

FOREIGN PATENT DOCUMENTS

| | | | | |
|---|---|---|---|---|
| CN | 102227645 A | | 10/2011 | |
| CN | 102735913 A | | 10/2012 | |
| CN | 102782511 A | | 11/2012 | |
| CN | 103293355 A | | 9/2013 | |
| CN | 102393489 B | * | 10/2013 | |
| CN | 103688140 A | | 3/2014 | |
| CN | 103901260 A | | 7/2014 | |
| CN | 104714164 A | | 6/2015 | |
| CN | 205941679 U | | 2/2017 | |
| CN | 107187328 A | * | 9/2017 | ............. B60L 58/10 |
| EP | 2244350 A2 | | 10/2010 | |
| JP | 2007042501 A | | 2/2007 | |
| JP | 2009156845 A | | 7/2009 | |
| JP | 201025925 A | | 2/2010 | |
| JP | 201169639 A | | 4/2011 | |
| JP | 2012220344 A | | 11/2012 | |
| JP | 201426752 A | | 2/2014 | |
| JP | 2014117068 A | | 6/2014 | |
| JP | 2014157084 A | | 8/2014 | |
| JP | 2014157717 A | | 8/2014 | |
| JP | 5638311 B2 | | 12/2014 | |
| JP | 2015203593 A | | 11/2015 | |
| JP | 5997081 B2 | | 9/2016 | |
| JP | 2017083303 A | | 5/2017 | |
| JP | 2017150925 A | | 8/2017 | |
| KR | 19980033179 U | | 9/1998 | |
| KR | 20080025076 A | | 3/2008 | |
| KR | 20110056699 A | | 5/2011 | |
| KR | 20130053501 A | | 5/2013 | |
| KR | 20130068986 A | | 6/2013 | |
| KR | 20140086461 A | | 7/2014 | |
| KR | 20140095781 A | | 8/2014 | |
| KR | 20160040887 A | | 4/2016 | |
| KR | 20170022162 A | | 3/2017 | |
| WO | 2005109600 A1 | | 11/2005 | |
| WO | 2010113455 A1 | | 10/2010 | |
| WO | 2012144373 A1 | | 10/2012 | |

OTHER PUBLICATIONS

Hande et al., "An electromechanical transfer circuit to measure individual battery voltages in series packs, Journal of Power Sources", available online Aug. 4, 2006, pp. 719-726, vol. 162, XP005712936.

International Search Report from Application No. PCT/KR2018/014210 dated Mar. 19, 2019, 2 pages.

Chinese Search Report for Application No. 201880044944.5 dated May 27, 2021, 4 pages.

Wen-Jeng Ho, et al., "Performance enhancement of ITO/oxide/semiconductor MOS-structure silicon solar cells with voltage biasing", Nanoscale Research Letters, Dec. 2014, pp. 1-5, No. 9, article No. 658, Springer Nature.

Yanfen Xia, "Uncertainty analysis report of standard battery electromotive force measurement results", Industrial Measurement, Dec. 2012, pp. 206-209 (Providing English translation of Abstract only).

* cited by examiner

FIG. 3

|  | Voltage of secondary battery and DCIR ||||||  |
|---|---|---|---|---|---|---|---|
|  | CV 1 | CV 2 | CV 3 | CV 4 | CV 5 | CV 6 |  |
| Voltage of secondary battery | 2.330 | 2.326 | 2.326 | 2.328 | 2.327 | 2.328 | ~① |
|  | 2.171 | 2.169 | 2.171 | 2.170 | 2.169 | 2.170 | ~② |
| DCIR | 0.795 | 0.785 | 0.775 | 0.79 | 0.79 | 0.79 | ~③ |
|  | 302 | 304 | 306 | 308 | 310 | 312 |  |

FIG. 6

|  | Voltage of secondary battery and DCIR ||||||  |
|---|---|---|---|---|---|---|---|
|  | CV 1 | CV 2 | CV 3 | CV 4 | CV 5 | CV 6 |  |
| Voltage of secondary battery | 2.19 | 2.191 | 2.191 | 2.192 | 2.19 | 2.191 | ~① |
|  | 2.002 | 2.043 | 2.041 | 2.039 | 2.039 | 2.038 | ~② |
| DCIR | 0.94 | 0.74 | 0.75 | 0.765 | 0.755 | 0.765 | ~③ |
|  | 402 | 404 | 406 | 408 | 410 | 412 |  |

400

APPARATUS AND METHOD FOR MEASURING VOLTAGE

CROSS-REFERENCE TO RELATED APPLICATIONS

The present application is national phase entry under § 371 of International Application No. PCT/KR2018/014210 filed Nov. 19, 2018, which claims priority to Korean Patent Application No. 10-2017-0172491 filed in the Republic of Korea on Dec. 14, 2017, the disclosures of which are incorporated herein by reference.

TECHNICAL FIELD

The present disclosure relates to an apparatus and method for measuring voltage, and more particularly, to an apparatus and method for measuring a voltage of a secondary battery included in a battery module.

BACKGROUND ART

Recently, there is dramatically growing demand for portable electronic products such as laptop computers, video cameras and mobile phones, and with the extensive development of accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, a very low self-discharge rate and high energy density.

Battery packs are used in various fields, and in many cases, they are used in applications requiring large capacity such as electric-drive vehicles or smart grid systems. To increase the capacity of battery packs, there may be a method that increases the capacity of secondary batteries or battery cells themselves, but in this case, the capacity increase effect is not so large, and there is a physical limitation on the size expansion of the secondary batteries. Accordingly, generally, a battery pack including a plurality of battery modules connected in series and in parallel is widely used.

In many cases, the battery pack includes a Battery Management System (BMS) to manage a battery module. Further, the BMS monitors the temperature, voltage and current of the battery module, and controls the balancing operation, the cooling operation, the charging operation or the discharge operation of the battery pack based on the monitored state of the battery module. For example, when the battery module includes a plurality of secondary batteries, the BMS measures voltage of the plurality of secondary batteries, and estimates Direct Current Internal Resistance (DCIR), State Of Charge (SOC) and State Of Health (SOH) of each secondary battery based on the measured voltage of the secondary batteries.

In conventional voltage measurement technology, the voltage of each secondary battery is measured using the operating potential of the components within the BMS that is equal to the reference potential for voltage measurement due to the convenience of measurement.

However, in the case of the conventional voltage measuring apparatus, the charge/discharge current flowing in the charge/discharge path provided in the battery pack flows in the internal components of the BMS, not the charge/discharge path, which causes an error in the measured voltage of the secondary battery and an error in the estimated DCIR, SOC and SOH.

SUMMARY

Technical Problem

The present disclosure is designed to solve the above-described problem, and therefore the present disclosure is directed to providing an apparatus and method for voltage measurement with improved reliability by reducing an error in voltage measurement in the process of measuring the voltage of each secondary battery provided in a battery module.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

To achieve the above-described object, an apparatus according to an embodiment of the present disclosure is connected to a battery module including a positive terminal, a negative terminal, a plurality of secondary batteries connected in series in a sequential order between the positive terminal and the negative terminal and a busbar. The apparatus includes a measuring unit including a plurality of voltage input terminals, each voltage input terminal electrically connected to two ends of a corresponding one of the plurality of secondary batteries to measure a voltage across the two ends of the corresponding one of the plurality of secondary batteries, and a first ground terminal electrically connected to a first reference ground electrically connected to the negative terminal of the battery module, and a control unit configured to receive the measured voltages of the plurality of secondary batteries from the measuring unit, and including a second ground terminal electrically connected to the first reference ground. One of the plurality of voltage input terminals is a reference voltage input terminal electrically connected to a second reference ground connected to a first end of the busbar to receive voltage applied to the second reference ground. The reference voltage input terminal is electrically separated from the first reference ground so that the reference voltage input terminal and the first reference ground have different reference potentials.

The control unit may be further configured to calculate a direct current internal resistance of at least one of the plurality of secondary batteries using the voltage across the two ends of the at least one of the plurality of secondary batteries.

The reference voltage input terminal is electrically connected to the second reference ground through a first wire. The first reference ground may be electrically connected to the negative terminal of the battery module through a second wire electrically separated from the first wire.

The reference voltage input terminal may have a voltage applied to the second reference ground connected to the first end of the busbar as the reference potential of the reference voltage input terminal. The first reference ground may have a voltage applied to the negative terminal of the battery module connected to a second end of the busbar as the reference potential of the first reference ground.

The first wire and the second wire may be electrically separated from each other on a printed circuit board.

The first wire and the second wire may be configured to prevent a charge/discharge current from flowing.

An apparatus according to another aspect of the present disclosure is connected to a battery module including a positive terminal, a negative terminal, a plurality of secondary batteries connected in series in a sequential order between the positive terminal and the negative terminal and a busbar. The apparatus includes a measuring unit including a plurality of voltage input terminals, each voltage input terminal electrically connected to two ends of a corresponding one of the plurality of secondary batteries to measure a voltage across the two ends of the corresponding one of the plurality of secondary batteries, and a plurality of current measurement terminals connected to two ends of a current sensor connected to the battery module to measure a voltage across the two ends of the current sensor, and a control unit configured to receive the measured voltages of the plurality of secondary batteries and the current sensor measured at a same measurement time from the measuring unit, calculate a voltage value of each of the plurality of secondary batteries based on the measured voltages of the plurality of secondary batteries, and calculate a current value based on the measured voltage of the current sensor. One of the plurality of voltage input terminals is a reference voltage input terminal electrically separated from a first reference ground so that the reference voltage input terminal and a first reference ground have different reference potentials. The reference voltage input terminal is electrically connected to a second reference ground connected to one end of the busbar to receive voltage applied to the second reference ground.

A battery pack according to still another aspect of the present disclosure includes the apparatus for measuring voltage as described in any of the embodiments herein.

A method according to yet another aspect of the present disclosure is for measuring a voltage of each of a plurality of secondary batteries using an apparatus connected to a battery module including a positive terminal, a negative terminal, and a busbar. The plurality of secondary batteries are connected in series in a sequential order between the positive terminal and the negative terminal. The method includes for each secondary battery of the plurality of secondary batteries, measuring a voltage across two ends of the secondary battery using a voltage applied to a reference voltage input terminal electrically connected to a second reference ground electrically separated from a first reference ground. The first reference ground has a first reference potential, and is electrically connected to the negative terminal of the battery module, and the second reference ground has a second reference potential. The method further includes calculating a direct current internal resistance of at least one secondary battery based on the measured voltage of the at least one secondary battery.

Advantageous Effects

According to the present disclosure, the reference potential for voltage measurement and the reference potential for operation of the voltage measuring apparatus are electrically separated from each other, and they have different potentials. Additionally, the charge/discharge current flowing through the charge/discharge path does not flow in the voltage measuring apparatus in the voltage measurement process.

Accordingly, it is possible to improve the reliability of voltage measurement in the voltage measurement process.

The present disclosure may have a variety of other effects, and these and other effects can be understood by the following description and will be apparent from the embodiments of the present disclosure.

DESCRIPTION OF DRAWINGS

The accompanying drawings illustrate a preferred embodiment of the present disclosure, and together with the following detailed description of the present disclosure, serve to provide a further understanding of the technical aspects of the present disclosure, and thus the present disclosure should not be construed as limited to the drawings.

FIG. 3 is a table for reference in describing the operation in which an apparatus for measuring voltage according to an embodiment of the present disclosure calculates the internal resistance of a secondary battery.

FIG. 6 is a table for reference in describing the operation in which an apparatus for measuring voltage according to a comparative example of the present disclosure calculates the internal resistance of a secondary battery.

DETAILED DESCRIPTION

Figure 1:
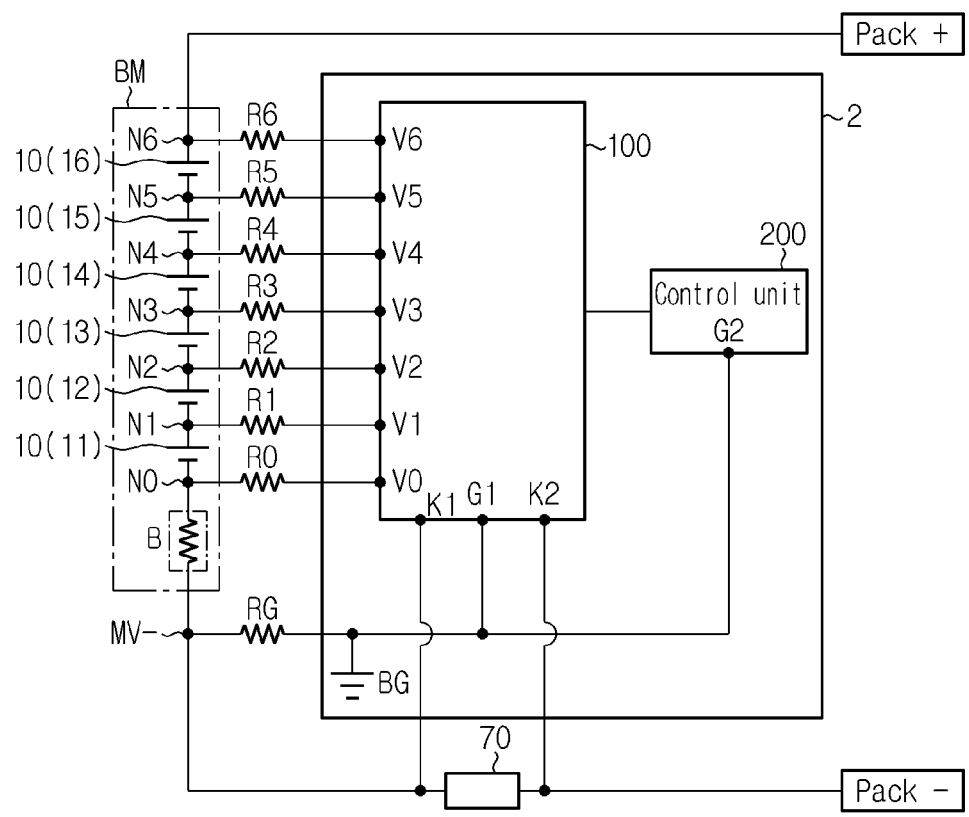
FIG. 1 is a schematic diagram showing connection between components of an apparatus for measuring voltage according to an embodiment of the present disclosure and a battery pack.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and variations could be made thereto at the time of filing the application.

Additionally, in describing the present disclosure, when it is deemed that a detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements. Additionally, the term 'control unit' as used herein refers to a processing unit of at least one function or operation, and this may be implemented in hardware or software alone or in combination.

In addition, throughout the specification, it will be further understood that when an element is referred to as being "connected to" another element, it can be directly connected to the other element or intervening elements may be present.

In the specification, a secondary battery may include one unit cell or a plurality of unit cells connected in parallel. The unit cell refers to a physically separable independent cell having a negative terminal and a positive terminal. For example, a pouch-type lithium polymer cell may be regarded as the unit.

FIG. 1 is a schematic diagram showing connection between components of an apparatus for measuring voltage according to an embodiment of the present disclosure and a battery pack 1.

Referring to FIG. 1, the battery pack 1 may include a battery module BM, a first power terminal Pack +, a second power terminal Pack –, an apparatus 2, and a current sensor 70. Particularly, the battery module BM and the current sensor 70 may be connected in series on the charge/discharge path electrically connecting the first power terminal Pack + of the battery pack 1 to the second power terminal Pack – of the battery pack 1. For example, as shown in the configuration of FIG. 1, the first power terminal Pack + of the battery pack 1 may be connected to the positive terminal of the battery module BM, and the negative terminal MV– of the battery module BM may be connected to one end of the current sensor 70. Additionally, the other end of the current sensor 70 may be connected to the second power terminal Pack – of the battery pack 1. The current sensor 70 may be a shunt resistor. Hereinafter, for convenience of description, assume that the battery module BM includes six secondary batteries 10. Of course, the number of secondary batteries 10 included in the battery module BM may be greater or less than six.

The battery module BM may include a plurality of secondary batteries 11, 12, 13, 14, 15, 16 and a busbar B. The plurality of secondary batteries 11, 12, 13, 14, 15, 16 may be electrically connected in series and/or in parallel to each other. For example, as shown in the configuration of FIG. 1, the plurality of secondary batteries 11, 12, 13, 14, 15, 16 may be electrically connected in series to each other between the positive terminal of the battery module BM and the negative terminal MV– of the battery module BM.

As shown in the configuration of FIG. 1, the busbar B may connect one end (e.g., the negative terminal) of at least one of the plurality of secondary batteries 11, 12, 13, 14, 15, 16 to the negative terminal MV– of the battery module BM. Particularly, the busbar B may electrically connect one end of the secondary battery 11 to the negative terminal MV– of the battery module BM in series. Here, the busbar B may have resistance, namely, the resistance component that impedes the flow of current. For example, the busbar B may be disposed between one end of the secondary battery 11 and the negative terminal MV– of the battery module BM. The busbar B may be a conductive metal plate.

As shown in the configuration of FIG. 1, the apparatus 2 may include a measuring unit 100 and a control unit 200. The measuring unit 100 may include a plurality of voltage input terminals V0, V1, V2, V3, V4, V5, V6 and a first ground terminal G1.

The plurality of voltage input terminals V0, V1, V2, V3, V4, V5, V6 may be electrically connected to two ends of each of the plurality of secondary batteries 11, 12, 13, 14, 15, 16 respectively. Particularly, a plurality of wire resistances R0, R1, R2, R3, R4, R5, R6 may be disposed between the plurality of voltage input terminals V0, V1, V2, V3, V4, V5, V6 and two ends of each of the plurality of secondary batteries 11, 12, 13, 14, 15, 16. The wire resistance may be resistance of the wire connecting the battery module BM to the apparatus 2. The voltage input terminal V0 may be also referred to as a reference voltage input terminal, and is electrically connected to a node N0 which is a point of connection between the negative terminal of the secondary battery 11 and the busbar B through the wire with the reference wire resistance R0. The voltage input terminal V1 is electrically connected to a node N1 which is a point of connection between the positive terminal of the secondary battery 11 and the negative terminal of the secondary battery 12 through the wire with the first wire resistance R1. The voltage input terminal V2 is electrically connected to a node N2 which is a point of connection between the positive terminal of the secondary battery 12 and the negative terminal of the secondary battery 13 through the wire with the second wire resistance R2. The voltage input terminal V3 is electrically connected to a node N3 which is a point of connection between the positive terminal of the secondary battery 13 and the negative terminal of the secondary battery 14 through the wire with the third wire resistance R3. The voltage input terminal V4 is electrically connected to a node N4 which is a point of connection between the positive terminal of the secondary battery 14 and the negative terminal of the secondary battery 15 through the wire with the fourth wire resistance R4. The voltage input terminal V5 is electrically connected to a node N5 which is a point of connection between the positive terminal of the secondary battery 15 and the negative terminal of the secondary battery 16 through the wire with the fifth wire resistance R5. The voltage input terminal V6 is electrically connected to a node N6 which is a point of connection between the positive terminal of the secondary battery 16 and the plus terminal Pack + through the wire with the sixth wire resistance R6. The node N0 may be also referred to as a second reference ground.

Accordingly, the plurality of voltage input terminals V0, V1, V2, V3, V4, V5, V6 may receive the voltages across the two ends of the plurality of secondary batteries 11, 12, 13, 14, 15, 16. Particularly, the plurality of voltage input terminals V0, V1, V2, V3, V4, V5, V6 may receive the voltage from the two ends of each of the plurality of secondary batteries 11, 12, 13, 14, 15, 16 respectively. In detail, as shown in the configuration of FIG. 1, the reference voltage input terminal V0 may be electrically connected to the second reference ground N0 through the wire with the reference wire resistance R0 to receive the voltage applied to the second reference ground N0 as second reference potential. Similarly, the first voltage input terminal V1 may receive the voltage applied to the first node N1 from the first node N1. Similarly, the second voltage input terminal V2 may receive the voltage applied to the second node N2 from the second node N2. Similarly, the third voltage input terminal V3 may receive the voltage applied to the third node N3 from the third node N3. Similarly, the fourth voltage input terminal V4 may receive the voltage applied to the fourth node N4 from the fourth node N4. Similarly, the fifth voltage input terminal V5 may receive the voltage applied to the fifth node N5 from the fifth node N5. Similarly, the sixth voltage input terminal V6 may receive the voltage applied to the sixth node N6 from the sixth node N6.

The first ground terminal G1 may be electrically connected to a reference ground BG electrically connected to the negative terminal MV− of the battery module BM. The reference ground BG may be electrically connected to the negative terminal MV− of the battery module BM through a wire with resistance RG. Particularly, the first ground terminal G1 may be directly connected to the reference ground BG. Through this configuration, the measuring unit 100 operates with the potential of the reference ground BG as operating reference potential (also referred to as 'first reference potential').

Preferably, the measuring unit 100 may further include a plurality of current measurement terminals K1, K2. The plurality of current measurement terminals K1, K2 may be connected to two ends of the current sensor 70 connected to the battery module BM to receive the voltage across the two ends of the current sensor 70. That is, the plurality of current measurement terminals K1, K2 may be connected to two ends of the current sensor 70 to receive the voltage across the two ends of the current sensor 70 from the two ends of the current sensor 70. In an embodiment, the measuring unit 100 may measure the direction, magnitude or amount of the current flowing in the current sensor 70 using the voltage across the two ends of the current sensor 70. For example, the measuring unit 100 may measure the current flowing in the current sensor 70 by substituting the pre-stored resistance of the current sensor 70 and the voltage across the two ends of the current sensor 70 into the Ohm's law.

The control unit 200 receives a voltage signal indicating the voltage across the two ends of each of the plurality of secondary batteries 11, 12, 13, 14, 15, 16 from the measuring unit 100. That is, the control unit 200 may be operably coupled to the measuring unit 100 to receive a voltage signal indicating the voltage across the two ends of the plurality of secondary batteries 11, 12, 13, 14, 15, 16 from the measuring unit 100. Particularly, the control unit 200 may receive the voltage signal indicating the voltage across the two ends of each of the plurality of secondary batteries 11, 12, 13, 14, 15, 16 from the measuring unit 100 in a preset cycle.

Preferably, the control unit 200 may receive the voltage across the two ends of each of the plurality of secondary batteries 11, 12, 13, 14, 15, 16 and the voltage across the two ends of the current sensor 70 from the measuring unit 100. Particularly, the control unit 200 may receive the voltage across the two ends of each of the plurality of secondary batteries 11, 12, 13, 14, 15, 16 and the voltage across the two ends of the current sensor 70 measured at the same measurement time or in the same measurement cycle from the measuring unit 100. Particularly, the control unit 200 receive the voltage signal indicating the voltage across the two ends of each of the plurality of secondary batteries 11, 12, 13, 14, 15, 16 and the voltage across the two ends of the current sensor 70 measured at the same time due to the synchronized measurement time or measurement cycle from the measuring unit 100.

Additionally, the control unit 200 may calculate a voltage value of each of the plurality of secondary batteries 11, 12, 13, 14, 15, 16 based on the voltage across the two ends of each of the plurality of secondary batteries 11, 12, 13, 14, 15, 16. For example, the control unit 200 may calculate a voltage value of the secondary battery 12 based on a voltage difference between two voltage input terminals (e.g., V2, V1).

Additionally, the control unit 200 may calculate a current value using the voltage across the two ends of the current sensor 70. For example, the control unit 200 may calculate a current value by substituting the pre-stored resistance of the current sensor 70 and the voltage across the two ends of the current sensor 70 into the Ohm's law.

Additionally, the control unit 200 may calculate Direct Current Internal Resistance (DCIR) of at least one of the plurality of secondary batteries 11, 12, 13, 14, 15, 16 using the voltage across the two ends of each of the plurality of secondary batteries 11, 12, 13, 14, 15, 16. Particularly, the control unit 200 may calculate the DCIR of the secondary battery 10 using the voltage across the two ends of the secondary battery 10 before and after charge and discharge and an amount of the current flowing in the current sensor 70. For example, the control unit 200 may calculate the DCIR using the following Equation 1.

$$DCIR_i = \frac{|CVi_A - CVi_B|}{I} \quad \text{<Equation 1>}$$

Here, $DCIR_i$ denotes the DCIR of the secondary battery $1i$, I denotes the magnitude of the current flowing through the current sensor 70, $CVi_A$ denotes the voltage across the two ends of the secondary battery $1i$ measured while the current does not flow through the current sensor 70, and $CVi_B$ denotes the voltage across the two ends of the secondary battery $1i$ measured while I flows through the current sensor 70.

Additionally, the control unit 200 may include a second ground terminal G2. The second ground terminal G2 may be electrically connected to the reference ground BG electrically connected to the negative terminal MV− of the battery module BM. Particularly, the second ground terminal G2 may be directly connected to the reference ground BG. Through this configuration, the control unit 200 may operate with the potential of the reference ground BG as the reference operating potential.

Additionally, the reference voltage input terminal V0 may be electrically connected to the second reference ground N0 connected to one end of the busbar B. Particularly, the reference voltage input terminal V0 may be connected to the second reference ground N0 directly connected to one end of the busbar B to receive the voltage applied to the second reference ground N0.

The measuring unit 100 may measure the voltage across the two ends of each of the plurality of secondary batteries 11, 12, 13, 14, 15, 16 using the voltage applied to the second reference ground N0 as reference potential (also referred to as 'second reference potential'). In detail, the measuring unit 100 may measure voltage of each secondary battery 11, 12, 13, 14, 15, 16 using the voltage applied to the second reference ground N0 as reference potential, and a potential difference between the voltage applied to each of the remaining voltage input terminals V1, V2, V3, V4, V5, V6 and the voltage applied to the reference voltage input terminal V0. In this instance, because the current does not flow in the wires connecting the battery module BM to the plurality of voltage input terminals V1, V2, V3, V4, V5, V6, a voltage drop due to the plurality of wire resistances RG, R0, R1, R2, R3, R4, R5, R6 may not occur.

For example, the voltage of the first secondary battery 11 is a potential difference between the second reference ground N0 and the first node N1, and may be measured using a potential difference between the reference voltage input terminal V0 and the first voltage input terminal V1. Similarly, the voltage of the second secondary battery 12 is a potential difference between the first node N1 and the second node N2, and may be measured using a potential difference between the first voltage input terminal V1 and the second voltage input terminal V2. Similarly, the voltage of the third secondary battery 13 is a potential difference between the second node N2 and the third node N3, and may be measured using a potential difference between the second voltage input terminal V2 and the third voltage input terminal V3. Similarly, the voltage of the fourth secondary battery 14 is a potential difference between the third node N3 and the fourth node N4, and may be measured using a potential difference between the third voltage input terminal V3 and the fourth voltage input terminal V4. Similarly, the voltage of the fifth secondary battery 15 is a potential difference between the fourth node N4 and the fifth node N5, and may be measured using a potential difference between the fourth voltage input terminal V4 and the fifth voltage input terminal V5. Similarly, the voltage of the sixth secondary battery 16 is a potential difference between the fifth node N5 and the sixth node N6, and may be measured using a potential difference between the fifth voltage input terminal V5 and the sixth voltage input terminal V6.

Particularly, the reference voltage input terminal V0 may be electrically separated from the reference ground BG within the apparatus 2. Additionally, the reference voltage input terminal V0 and the reference ground BG may have different reference potentials from each other. This will be described in detail in the description of FIG. 2.

Meanwhile, the control unit 200 may be implemented such that it selectively includes a processor, an Application-Specific Integrated Circuit, a chipset, a logic circuit, a register, a communication modem and/or a data processing device known in the art to perform the operation as described above.

Preferably, the control unit 200 may include a memory device. The memory device is not limited to a particular type and includes any storage medium capable of recording and erasing information. For example, the memory device may be RAM, ROM, register, hard disk, optical recording media or magnetic recording media. The memory device may be electrically connected to the control unit 200 through, for example, data bus to allow the control unit 200 to access it. The memory device may store and/or update and/or erase and/or transmit programs including various types of control logics executed by the control unit 200 and/or data created when the control logics are executed. The memory device may be logically split into two or more.

Figure 2:
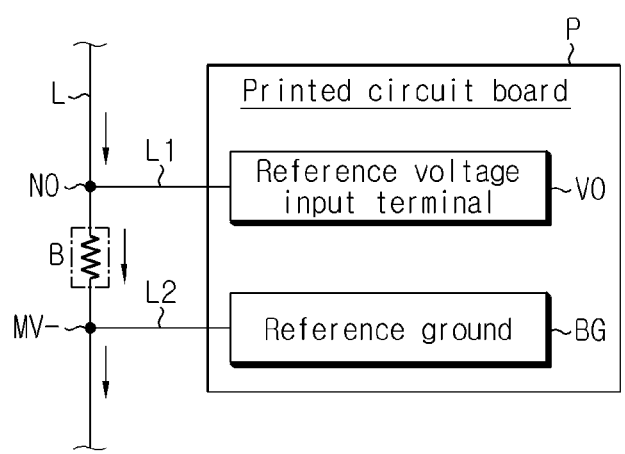
FIG. 2 is a schematic diagram showing connection between a BMS printed circuit board including an apparatus for measuring voltage according to an embodiment of the present disclosure and a charge/discharge path of a battery pack.

FIG. 2 is a schematic diagram showing connection between the apparatus 2 for voltage measurement according to an embodiment of the present disclosure and the charge/discharge path of the battery pack 1. Here, difference(s) between this embodiment and the previous embodiment will be primarily described, and a description, to which the description of the previous embodiment may be equally or similarly applied, is omitted herein.

Referring to FIGS. 1 and 2, the apparatus 2 according to the present disclosure may include a printed circuit board P. Particularly, the printed circuit board P may be electrically connected to the charge/discharge path L of the battery pack 1. For example, as shown in FIG. 2, the second reference ground N0 may be a contact point at which one end of the busbar B disposed on the charge/discharge path L and a first wire L1 are connected in common. Additionally, the negative terminal MV− of the battery module BM may be a contact point at which the other end of the busbar B on the charge/discharge path L and a second wire L2 are connected in common. Here, the first wire L1 may be the wire electrically connecting the reference voltage input terminal V0 on the printed circuit board P to the second reference ground N0. Additionally, the second wire L2 may be the wire electrically connecting the reference ground BG on the printed circuit board P to the negative terminal MV− of the battery module. The first wire L1 may have the resistance R0. The second wire L2 may have the resistance RG.

Preferably, the reference potential for sensing the voltage across the two ends of each of the plurality of secondary batteries 11, 12, 13, 14, 15, 16 may be applied to the reference voltage input terminal V0. Additionally, the reference potential for the operation of the components 100, 200 included in the apparatus 2 may be applied to the reference ground BG. Further, the apparatus 2 may be included in a battery management system (BMS). Other components of the BMS such as a Micro Controller Unit (MCU) may also operate at the reference potential applied from the reference ground BG. Particularly, the reference voltage input terminal V0 may have the voltage applied to the second reference ground N0 connected to one end of the busbar B as the reference potential, and the reference ground BG may have the voltage applied to the negative terminal MV− of the battery module connected to the other end of the busbar B as the reference potential.

Here, the component of the BMS may be mounted in the printed circuit board P in the form of a chip or circuit. For example, the reference ground BG may be mounted in the printed circuit board P by soldering onto the circuit. Alternatively, the reference voltage input terminal V0 may come into contact with the printed circuit board P. For example, the printed circuit board P may be a Printed Circuit Board (PCB).

Particularly, the first wire L1 and the second wire L2 may be electrically separated from each other on the printed circuit board P. That is, the first wire L1 and the second wire L2 may be configured such that they are electrically separated from each other on the printed circuit board P.

Preferably, the first wire L1 and the second wire L2 may be configured to prevent the charge/discharge current from flowing on. In detail, the first wire L1 and the second wire L2 may be electrically isolated from each other on the printed circuit board P so that the first wire L1 and the second wire L2 may be separated from each other to prevent the current from flowing between. That is, the reference voltage input terminal V0 may be electrically connected to the second reference ground N0 through the first wire L1, and the reference ground BG may be electrically connected to the negative terminal MV− of the battery module through the second wire L2 electrically separated from the first wire L1 in the BMS. Through this configuration, as opposed to the conventional art, the apparatus 2 has no path of current that flows into the BMS through the charge/discharge path during charging and discharging, and may provide electrical isolation between the charge/discharge path and the BMS.

For example, as shown in the configuration of FIG. 2, the apparatus 2e may have the first wire L1 and the second wire L2 electrically separated from each other on the printed circuit board P for electrical isolation between the charge/discharge path L and the BMS to prevent the current from flowing from the charge/discharge path L into the BMS. For example, the charge/discharge current passing through the second reference ground N0 on the charge/discharge path L flows in the busbar B, not the first wire L1. Additionally, the charge/discharge current passing through the busbar B does not flow in the second wire L2, and instead, flows through the negative terminal MV− of the battery module.

FIG. 3 is a table for reference in describing the operation in which the apparatus 2 for measuring voltage according to an embodiment of the present disclosure calculates the internal resistance of the secondary battery.

Referring to FIGS. 1 and 3, the apparatus 2 may calculate the internal resistance of the secondary battery. Preferably, the memory device may include a table 300 used to calculate the internal resistance of the secondary battery. The table 300 includes a plurality of records 302, 304, 306, 308, 310, 312. Each record may include (i) the voltages of the secondary battery before and after charge and discharge and (ii) DCIR of the secondary battery associated with the voltage of the secondary battery. In the table of FIG. 3, ① is the voltage of the secondary battery measured while the discharge current does not flow, ② is the voltage of the secondary battery measured while the discharge current flows, and ③ is the DCIR of the secondary battery associated with the voltages of the secondary battery before and after discharge. For example, the first record 302 is a record for the DCIR of the first secondary battery 11. Additionally, the second record 304 is a record for the DCIR of the second secondary battery 12. Likewise, the third to sixth records 306, 308, 310, 312 are records of the DCIR of the third to sixth secondary batteries 13, 14, 15, 16 in that order.

Particularly, the plurality of records 302, 304, 306, 308, 310, 312 does not have a large deviation in ① the voltage of the secondary battery measured before discharge, ② the voltage of the secondary battery measured after discharge, and ③ the DCIR of the secondary battery associated with the voltages of the secondary battery before and after discharge.

For example, referring to the first record 302, the voltage of the secondary battery measured before discharge is 2.330V, and the deviation between the first record 302 and the second to sixth records 304, 306, 308, 310, 312 is not too large. Additionally, the voltage of the secondary battery measured after discharge is 2.171V, and the deviation between the first record 302 and the second to sixth records 304, 306, 308, 310, 312 is not too large. Additionally, the DCIR of the secondary battery associated with the voltages of the secondary battery before and after discharge is 0.795Ω, and the deviation between the first record 302 and the second to sixth records 304, 306, 308, 310, 312 is not too large.

The apparatus 2 may accurately measure the internal resistance of the secondary battery without large deviation in the internal resistance for each secondary battery. In detail, the apparatus 2 may achieve accurate voltage measurement of the secondary battery during charging and discharging of the secondary battery. Accordingly, it is possible to improve the reliability of estimation of State Of Health (SOH) and State Of Charge (SOC) of the secondary battery performed by the MCU included in the BMS.

The apparatus 2 may be included in the BMS. In this configuration, at least some of the components of the apparatus 2 for measuring voltage according to the present disclosure may be implemented by supplementing or adding the functions of the components included in the conventional BMS. For example, the measuring unit and the control unit of the apparatus 2 may be implemented as the components of the BMS.

Figure 4:
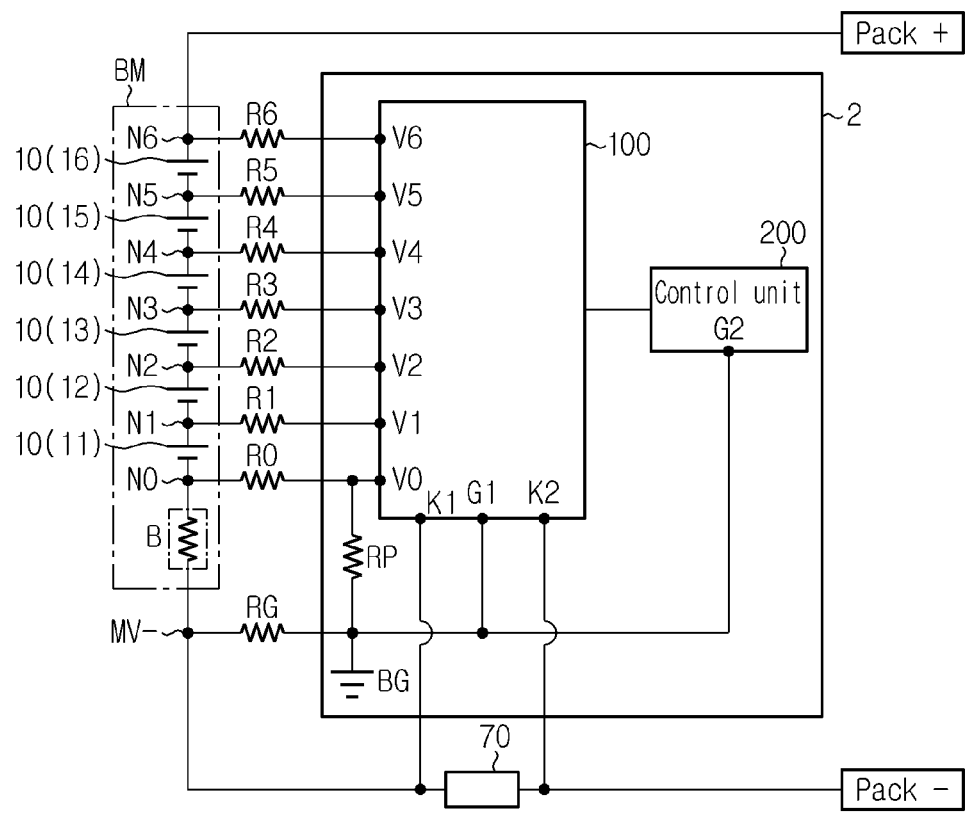
FIG. 4 is a schematic diagram showing connection between components of an apparatus for measuring voltage according to a comparative example of the present disclosure and a battery pack.
Figure 5:
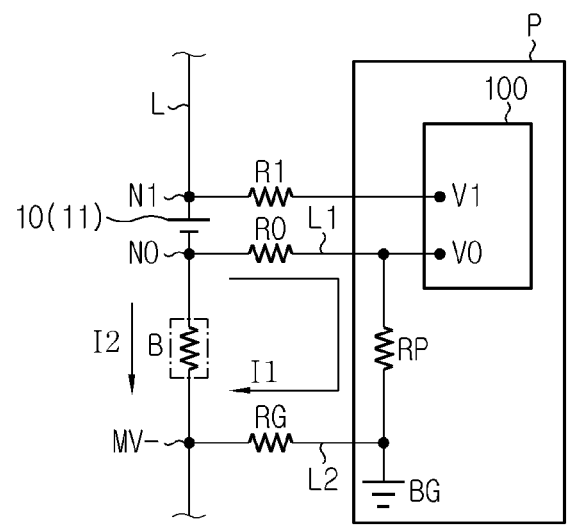
FIG. 5 is a diagram for reference in describing a current path formed by an apparatus for measuring voltage according to a comparative example of the present disclosure.

FIG. 4 is a schematic diagram showing connection between components of the apparatus 2 for measuring voltage according to a comparative example of the present disclosure and the battery pack 1. FIG. 5 is a diagram for reference in describing a current path formed by the apparatus 2 for measuring voltage according to a comparative example of the present disclosure. A detailed description to which the description of the connection between the components of the apparatus 2 for measuring voltage and the battery pack 1 as described in FIG. 1 may be equally or similarly applied is omitted herein, and difference(s) between this embodiment and the previous embodiment will be primarily described.

Referring to FIGS. 4 and 5, the apparatus 2 for measuring voltage according to a comparative example of the present disclosure may be configured to allow the current to flow between the charge/discharge path L of the battery pack 1 and the BMS. In detail, the apparatus 2 for measuring voltage according to a comparative example of the present disclosure may have a current path on the printed circuit board P, through which the current transmitted from the charge/discharge path L flows. For example, as shown in the configuration of FIGS. 4 and 5, the apparatus 2 for measuring voltage according to a comparative example of the present disclosure may have the reference voltage input terminal V0 and the reference ground BG electrically connected to each other. In detail, the reference voltage input terminal V0 and the reference ground BG may be electrically connected to each other on the printed circuit board P. Here, there may be pattern resistance RP between the reference voltage input terminal V0 and the reference ground BG. That is, the pattern resistance RP may be resistance of a pattern or circuit connecting the reference voltage input terminal V0 to the reference ground BG on the printed circuit board P.

Additionally, the apparatus 2 for measuring voltage according to a comparative example of the present disclosure may have the first wire L1 and the second wire L2 through which the current flows during charging and discharging. For example, as shown in the configuration of FIG. 5, two current paths I1, I2 may be formed, through which the current may flow from the second reference ground N0 to the negative terminal MV− of the battery module. In detail, a first path I1 passing through the first wire L1 and the second wire L2 and a second path I2 passing through the busbar B may be formed.

Here, referring to FIGS. 1 and 4, in the case of the apparatus 2 as shown in FIG. 1, the voltage of the first secondary battery 11 measured through a potential difference between the reference voltage input terminal V0 and the first voltage input terminal V1 may be calculated using the following Equation 2.

$$V1 = CV1 + V0 \qquad \text{<Equation 2>}$$

In Equation 2, V1 is the voltage applied to the first voltage input terminal V1, V0 is the voltage applied to the reference voltage input terminal V0, and CV1 is the voltage across the two ends of the first secondary battery 11. That is, the apparatus 2 for measuring voltage according to an embodiment of the present disclosure as shown in FIG. 1 does not have an error in voltage measurement.

In the case of the apparatus 2 for measuring voltage according to a comparative example of the present disclosure as shown in FIG. 4, the voltage of the first secondary battery 11 measured through a potential difference between the reference voltage input terminal V0 and the first voltage input terminal V1 may be calculated using the following Equation 3.

$$V1 = CV1 - \frac{R0}{R0 + RP + RG} \times V_B + V0 \quad \langle\text{Equation 3}\rangle$$

Here, V1 is the voltage applied to the first voltage input terminal V1, V0 is the voltage applied to the reference voltage input terminal V0, CV1 is the voltage across the two ends of the first secondary battery 11, and $V_B$ is the voltage applied to the two ends of the busbar B. Referring to FIG. 5 together, due to the formation of the current path I1 flowing in the first wire L1 and the second wire L2, the voltage applied to the reference voltage input terminal V0 is affected by a voltage drop by the resistance R0, and consequently, the apparatus 2 for measuring voltage according to a comparative example of the present disclosure as shown in FIG. 4 has an error in voltage measurement.

FIG. 6 is a table for reference in describing the operation in which the apparatus 2 for measuring voltage according to a comparative example of the present disclosure calculates the internal resistance of the secondary battery.

FIG. 6 shows the exemplary table 400 used for the apparatus 2 for measuring voltage according to a comparative example of the present disclosure to calculate the internal resistance of the secondary battery. The table 400 includes a plurality of records 402, 404, 406, 408, 410, 412. Each record may include (i) voltages of the secondary battery before and after charge and discharge, and (ii) DCIR of the secondary battery associated with the voltages of the secondary battery. Referring to FIGS. 4 and 6, ① is the voltage of the secondary battery measured before discharge, ② is the voltage of the secondary battery measured after discharge, and ③ is the DCIR of the secondary battery associated with the voltages of the secondary battery 10 before and after discharge. For example, the first record 402 is a record of the DCIR for the first secondary battery 11. Additionally, the second record 404 is a record of the DCIR for the second secondary battery 12. Likewise, the third to sixth records 406, 408, 410, 412 are records of the DCIR for the third to sixth secondary batteries 13, 14, 15, 16, respectively.

Particularly, when comparing the first record 402 of the plurality of records 402, 404, 406, 408, 410, 412 with the second to sixth records 404, 406, 408, 410, 412, the deviation in ① the voltage of the secondary battery measured before discharge is not too large, while large deviation may occur in ② the voltage of the secondary battery measured after discharge and ③ the DCIR of the secondary battery associated with the voltages of the secondary battery before and after discharge.

For example, referring to the first record 402, the voltage of the secondary battery measured after discharge is 2.002V, and when compared with the second to sixth records 404, 406, 408, 410, 412 showing the distribution of 2.038V to 2.043V, the deviation of 0.0385V on the average may occur. Additionally, in the case of the first record 402, the DCIR is 0.94Ω, and when compared with the second to sixth records 404, 406, 408, 410, 412 showing the distribution of 0.74Ω to 0.765Ω, the deviation of 0.1875Ω on the average may occur.

Accordingly, in the case of the apparatus 2 for measuring voltage according to a comparative example of the present disclosure, an error in voltage measurement of the secondary battery occurs, and an error in measurement of the internal resistance calculated based on the voltage of the secondary battery may occur. Additionally, when an error in voltage measurement occurs, an error in estimation of State Of Health (SOH) and State Of Charge (SOC) of the secondary battery may occur.

Figure 7:
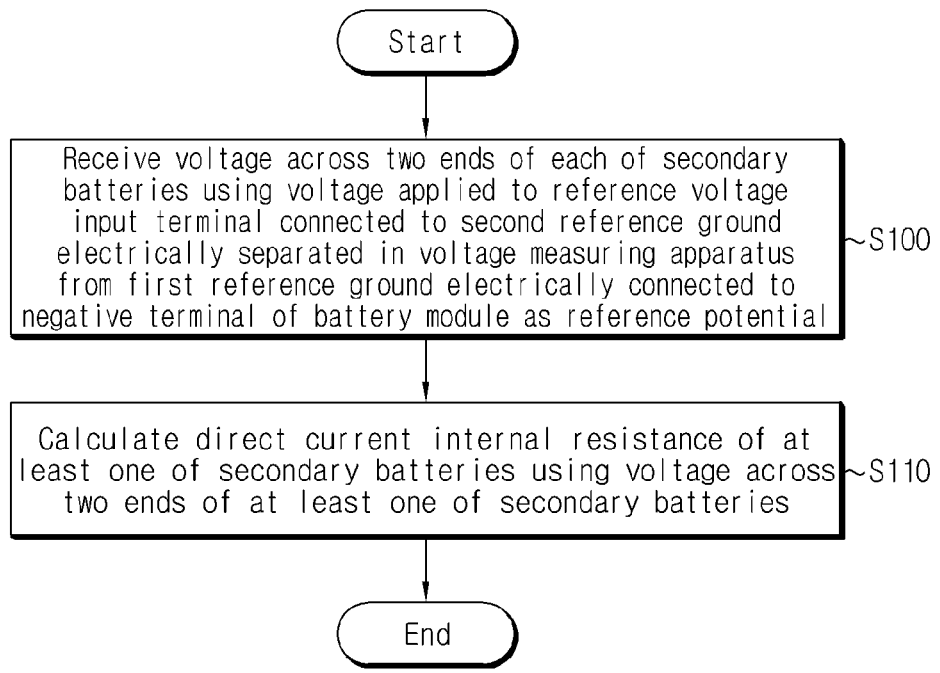
FIG. 7 is a schematic flowchart showing a method for measuring voltage according to an embodiment of the present disclosure.

FIG. 7 is a schematic flowchart showing a method for measuring voltage according to an embodiment of the present disclosure. In FIG. 7, the subject that performs each step may be each component of the apparatus 2 for measuring voltage according to the present disclosure as previously described.

As shown in FIG. 7, in step S100, the measuring unit 100 receives the voltage across the two ends of each of the plurality of secondary batteries 11, 12, 13, 14, 15, 16 using voltage applied to the reference voltage input terminal V0 as the reference potential. The reference voltage input terminal V0 is electrically separated from the reference ground BG electrically connected to the negative terminal MV− of the battery module BM in the apparatus 2. The reference potential provided from the reference ground BG is different from the reference potential provided from the reference voltage input terminal V0.

In step S100, the control unit 200 calculates the DCIR of at least one of the plurality of secondary batteries 11, 12, 13, 14, 15, 16 using the voltage across the two ends of at least one of the plurality of secondary batteries 11, 12, 13, 14, 15, 16 received in the step S100.

Additionally, when the control logics are implemented in software, the control unit 200 may be implemented as a set of program modules. In this instance, the program module may be stored in the memory device and executed by the processor.

Additionally, there is no particular limitation on the type of control logics of the control unit if at least one of control logics may be combined and the combined control logics may be written in computer-readable coding system to allow the computer to access and read. For example, the recording media includes at least one selected from the group consisting of ROM, RAM, register, CD-ROM, magnetic tape, hard disk, floppy disk and an optical data recording device. Additionally, the coding system may be stored and executed in computers connected via a network in distributed manner. Additionally, functional programs, codes and code segments for implementing the combined control logics may be readily inferred by programmers in the technical field to which the present disclosure belongs.

While the present disclosure has been hereinabove described with regard to a limited number of embodiments and drawings, the present disclosure is not limited thereto and various modifications and changes may be made by those skilled in the art within the technical aspects of the present disclosure and the equivalent scope of the appended claims.

Although the term 'unit' such as 'measuring unit' and 'control unit' is used herein, it refers to a logical component unit, and it is obvious to those skilled in the art that the term does not necessarily indicate a component that may or should be physically separated.

What is claimed is:

1. An apparatus, connected to a battery module including a positive terminal, a negative terminal, a plurality of secondary batteries connected in series in a sequential order between the positive terminal and the negative terminal and a busbar, the apparatus comprising:

a measuring unit including a plurality of voltage input terminals, each voltage input terminal electrically connected to two ends of a corresponding one of the plurality of secondary batteries to measure a voltage across the two ends of the corresponding one of the plurality of secondary batteries, and a first ground terminal electrically connected to a first reference ground electrically connected to the negative terminal of the battery module; and a control unit configured to receive the measured voltages of the plurality of secondary batteries from the measuring unit, and including a second ground terminal electrically connected to the first reference ground, wherein one of the plurality of voltage input terminals is a reference voltage input terminal electrically connected to a second reference ground connected to a first end of the busbar to receive a voltage applied to the second reference ground, and wherein the reference voltage input terminal is electrically separated from the first reference ground so that the reference voltage input terminal and the first reference ground have different reference potentials.

2. The apparatus according to claim 1, wherein the control unit is further configured to calculate a direct current internal resistance of at least one of the plurality of secondary batteries using the voltage across the two ends of the at least one of the plurality of secondary batteries.

3. The apparatus according to claim 1, wherein the reference voltage input terminal is electrically connected to the second reference ground through a first wire, and wherein the first reference ground is electrically connected to the negative terminal of the battery module through a second wire electrically separated from the first wire.

4. The apparatus according to claim 3, wherein the reference voltage input terminal has a voltage applied to the second reference ground connected to the first end of the busbar as the reference potential of the reference voltage input terminal, and the first reference ground has a voltage applied to the negative terminal of the battery module connected to a second end of the busbar as the reference potential of the first reference ground.

5. The apparatus according to claim 3, wherein the first wire and the second wire are electrically separated from each other on a printed circuit board.

6. The apparatus according to claim 5, wherein the first wire and the second wire are configured to prevent a charge/discharge current from flowing.

7. An apparatus, connected to a battery module including a positive terminal, a negative terminal, a plurality of secondary batteries connected in series in a sequential order between the positive terminal and the negative terminal and a busbar, the apparatus comprising:

a measuring unit including a plurality of voltage input terminals, each voltage input terminal electrically connected to two ends of a corresponding one of the plurality of secondary batteries to measure a voltage across the two ends of the corresponding one of the plurality of secondary batteries, and a plurality of current measurement terminals connected to two ends of a current sensor connected to the battery module to measure a voltage across the two ends of the current sensor; and a control unit configured to:
receive the measured voltages of the plurality of secondary batteries and the current sensor measured at a same measurement time from the measuring unit;
calculate a voltage value of each of the plurality of secondary batteries based on the measured voltages of each of the plurality of secondary batteries; and
calculate a current value based on the measured voltage of the current sensor, wherein one of the plurality of voltage input terminals is a reference voltage input terminal electrically separated from a first reference ground so that the reference voltage input terminal and a first reference ground have different reference potentials, and wherein the reference voltage input terminal is electrically connected to a second reference ground connected to one end of the busbar to receive a voltage applied to the second reference ground.

8. A battery pack comprising the apparatus according to claim 1.

9. A method for measuring a voltage of each of a plurality of secondary batteries using an apparatus connected to a battery module including a positive terminal, a negative terminal, and a busbar, wherein the plurality of secondary batteries are connected in series in a sequential order between the positive terminal and the negative terminal, the method comprising:

for each secondary battery of the plurality of secondary batteries, measuring a voltage across two ends of the secondary battery using a voltage applied to a reference voltage input terminal electrically connected to a second reference ground electrically separated from a first reference ground, wherein the first reference ground has a first reference potential and is electrically connected to the negative terminal of the battery module, and wherein the second reference ground has a second reference potential; and calculating a direct current internal resistance of at least one secondary battery based on the measured voltage of the at least one secondary battery.

\* \* \* \* \*